United States Patent [19]

Pfeifer et al.

[11] 4,442,351

[45] Apr. 10, 1984

[54] OPTOELECTRONIC INCREMENTAL POSITION ENCODER

[75] Inventors: George F. Pfeifer; George R. Koonce, both of Liverpool; Jack E. Phillips, Fayetteville, all of N.Y.

[73] Assignee: General Electric Company, Schenectady, N.Y.

[21] Appl. No.: 308,219

[22] Filed: Oct. 5, 1981

[51] Int. Cl.³ .............................................. H01J 3/14
[52] U.S. Cl. ............................. 250/237 G; 340/347 P
[58] Field of Search ........ 250/237 G, 231 R, 231 SE; 340/347 P; 356/395, 396

[56] References Cited

U.S. PATENT DOCUMENTS

| | | | |
|---|---|---|---|
| 4,092,571 | 5/1978 | Hopkins et al. | 318/106 |
| 4,218,615 | 8/1980 | Zinn, Jr. | 250/231 |
| 4,342,910 | 8/1982 | Pfeifer et al. | 340/347 P X |
| 4,382,250 | 5/1983 | Radaelli | 250/237 G X |

Primary Examiner—F. L. Evans
Attorney, Agent, or Firm—Marvin Snyder; James C. Davis, Jr.

[57] ABSTRACT

An optoelectronic incremental position encoder mechanically coupled to an accelerator pedal or lever in a battery powered vehicle provides a linear or nonlinear control voltage corresponding to the pedal or lever position. Clear and opaque windows for encoding accelerator position are fabricated on an encoder slide in an in-line arrangement which minimizes decoding errors due to stray light and skewed encoder components. In the preferred embodiment, the binary output from an up/down counter, driven by a position decoder, is converted to analog form and applied to a linear or nonlinear function generator circuit. The nonlinear function generator circuit comprises parallel-coupled amplifier stages, the outputs of which are selectively clamped depending on the amplitude of the input signal from a digital-to-analog converter.

14 Claims, 9 Drawing Figures

OPTOELECTRONIC INCREMENTAL POSITION ENCODER

BACKGROUND OF THE INVENTION

This application is related to U.S. Pat. No. 4,342,910, issued Aug. 3, 1982 to the same applicants and assigned to the same assignee as the present invention.

This invention relates to accelerator position encoders. More specifically, this invention relates to an optoelectronic incremental position encoder for providing linear or nonlinear control voltage representative of accelerator position.

Accelerator position encoders are employed in battery powered vehicles such as fork lift trucks, mining vehicles, and on-road vehicles to provide an interface between the accelerator pedal or lever and traction drive control circuitry. In response to the accelerator position-indicating signal from the encoder, the traction drive control circuit regulates the energy supplied to the vehicle's traction motor by an inverter or converter. Typically, mechanical linkage elements are provided to transmit the motion of the accelerator to the encoder which provides an electrical signal corresponding to the position of the accelerator. Frequently, the mechanical linkage also operates a cam-activated safety switch or contactor connected in series with the electric vehicle's battery. The switch is designed to be open when the accelerator is at rest so that chances of accidental start-up of the traction motor are minimized.

Generally, a "full-on" detect circuit is also included in combination with the position encoder. The circuit is designed to detect a predetermined output signal from the position encoder, indicating that the accelerator is in a preselected position. Typically, it is desirable to detect when the accelerator has traveled more than 90 percent of its maximum range. The "full-on" signal from the detect circuit and a separate indication of demand for maximum power output from the traction motor activate a contactor which bypasses power-consuming traction drive control circuitry and applies full battery potential to the traction motor. Demand for maximum power in a fork-lift truck, for example, occurs when a load, too heavy to lift, is pushed along the floor surface.

Among the devices employed in conventional encoders are nonlinear potentiometers, optically transparent disks (the optical transmissivity of which varies along the circumference), and linear voltage differential transformers (LVDT).

In encoders utilizing a nonlinear potentiometer, output voltage is dependent on the position of the potentiometer shaft which is usually coupled to rotate in response to accelerator motion. The useful working life of a potentiometer is, however, relatively short due to the mechanical wearing of the moving parts. Potentiometers are also sensitive to mechanical vibration and shock. Operation of an encoder utilizing an optical encoder disk is similar to that employing a potentiometer in that the degree of disk rotation from a start point is dependent on accelerator position. The encoder output voltage is determined by the optical transmissivity of the disk portion between a light source and a photodetector.

In encoders employing a LVDT, the accelerator is coupled to a movable core disposed through two identical transformer secondary windings. Actuation of the accelerator displaces the core so that a greater portion of it is within one of the windings. This results in unequal flux concentration through the windings and concomitantly different output voltages from each. The precise difference, indicative of accelerator position, is obtained by rectification and subtraction of the respective winding voltages.

The present invention constitutes an optoelectronic incremental position encoder which is useful in sensing the position of an accelerator or lever in a battery powered vehicle and which provides a digital linear or analog nonlinear or linear output signal in response thereto. The optoelectronic position encoder is a low-cost, long-life, and reliable device compared to the devices of the prior art.

The optoelectronic encoder employs an encoder slide and optoelectronic interrupters for non-contact position sensing. The clear and opaque slide patterns are fabricated in an in-line fashion, rather than side by side. This arrangement minimizes encoding errors associated with the side-by-side configuration in which the transparent windows are parallel to each other, and in which slight skewing or mechanical tilting of the slide with respect to optoelectronic interrupters produces errors in the position indicating signals because the edges of the slide windows do not line up.

The optoelectronic encoder of this invention also provides superior immunity to system electrical noise, electromagnetic interference, mechanical vibration, and shock. Filtering circuits and CMOS integrated circuit devices further help improve encoder immunity to the above-identified sources of noise. Additionally, the encoder requires only a simple optical alignment of an encoder mask since in the preferred embodiment, electrical adjustments to obtain a desired encoder output voltage function are made during the fabrication of encoder circuitry.

SUMMARY OF THE INVENTION

The optoelectronic incremental position encoder of the present invention constitutes an optical interrupter assembly, including a plurality of paths for optical wavelength radiation to pass therethrough and a plurality of photodetectors. Each photodetector is situated to receive the radiation in a separate one of the paths of optical wavelength radiation, respectively. An encoder slide, positioned for linear movement with respect to the interrupter, has optically transmissive windows arranged in tandem and colinear with the line of slide movement so that the photodetectors can detect the radiation transmitted through the windows. Circuit means coupled to selected photodetectors provide electronic output signals and logic complement signals thereof to a decoder. The decoder is coupled at its output to a counter so that in response to the count thereof, the decoder can select one of the signals applied thereto and supply a signal to the counter to cause the counter to count. The count is indicative of the position of the slide.

Accordingly, it is an object of the invention to provide a low-cost, optoelectronic incremental position encoder accelerator control providing long-life, reliable operation, and which is operable over a wide range of operating conditions.

Another object of the invention is to provide an optoelectronic incremental position encoder which causes relatively few decoding errors due to stray light and skewed encoder components.

Still another object of the invention is to provide an optoelectronic incremental position encoder accelerator control which exhibits superior immunity to electrical noise and electromagnetic interference.

Another object is to provide an optoelectronic incremental position encoder employing a mask which is simple to align.

Another object is to provide an optoelectronic incremental position encoder accelerator control requiring only minimal post-fabrication adjustment.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
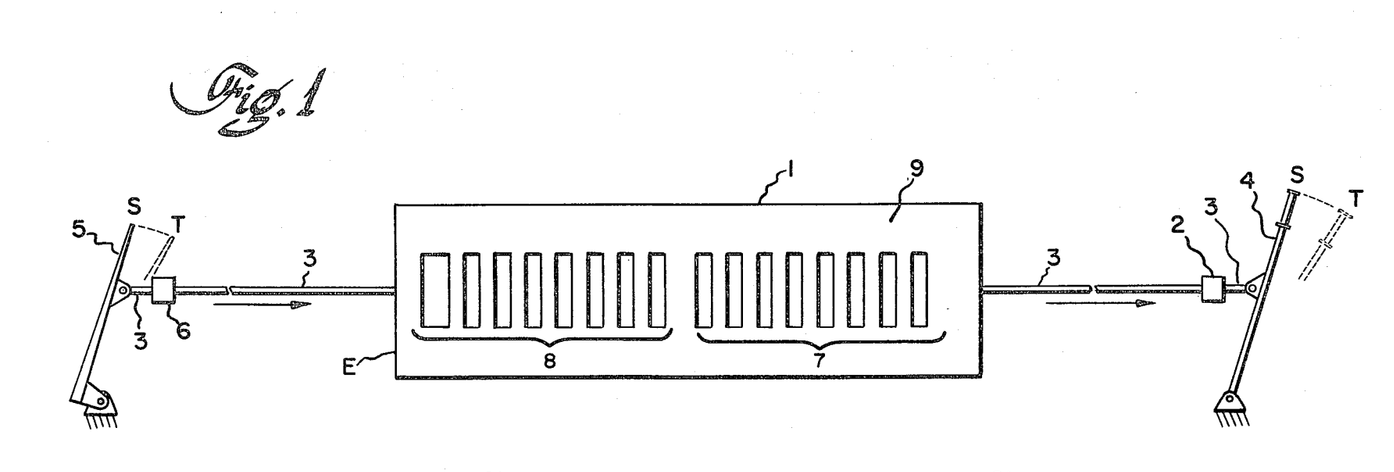
FIG. 1 illustrates an encoder slide in accordance with the invention.
Figure 3A:
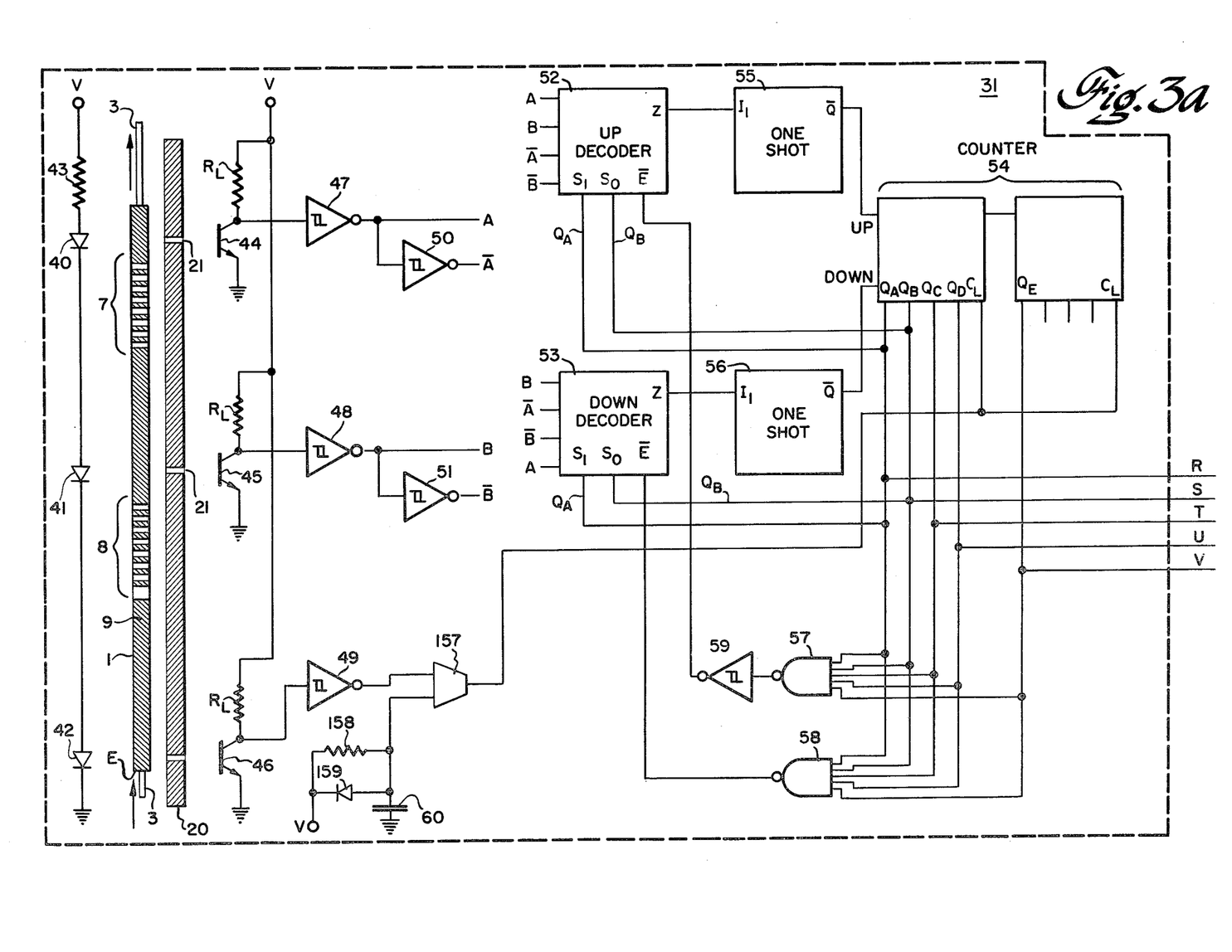
FIG. 3a is a partial schematic diagram of an optoelectronic incremental position encoder depicting the encoder assembly in accordance with the present invention.
Figures 3B, 3C:
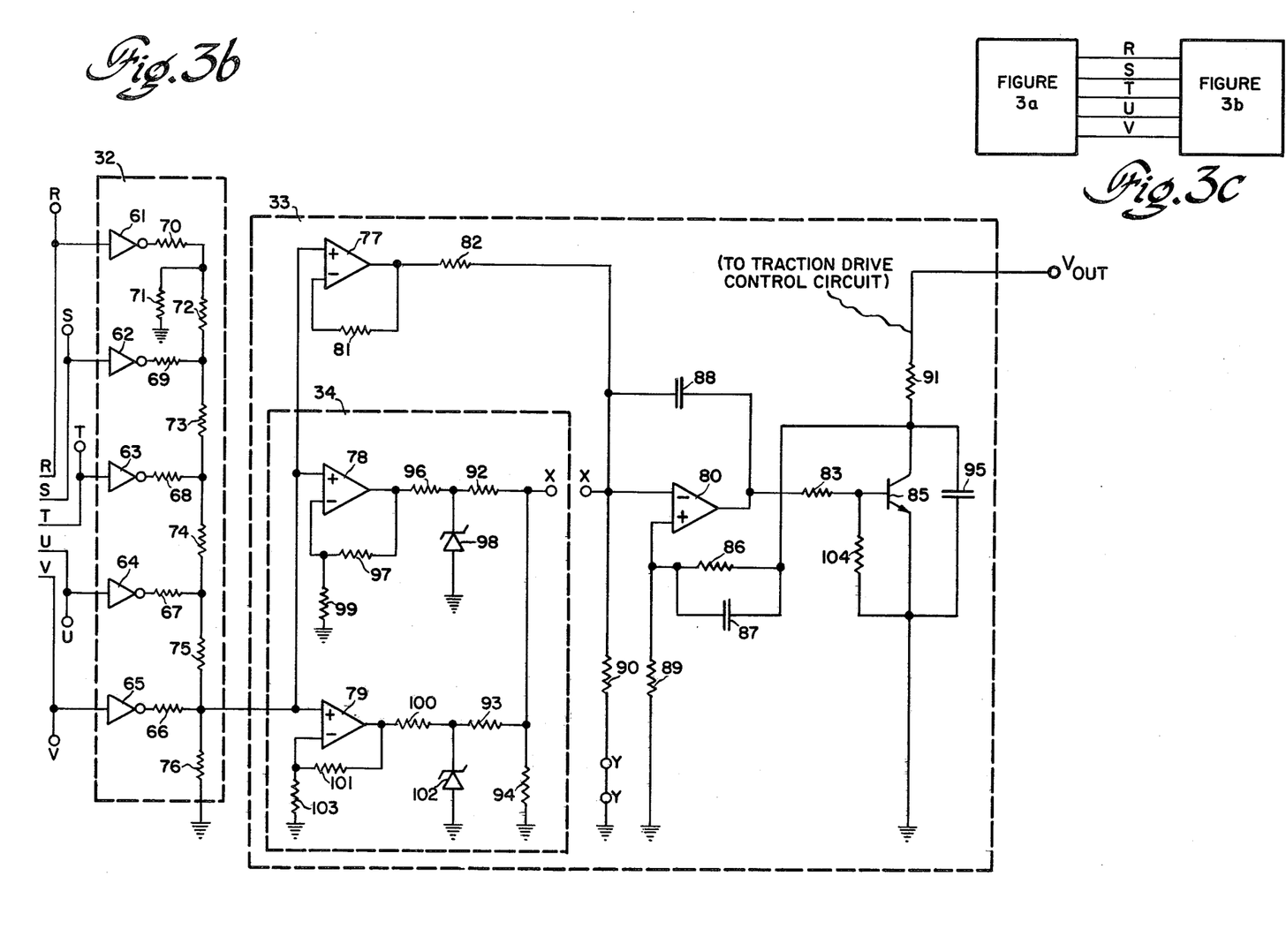
FIG. 3b is a partial schematic diagram of the optoelectronic incremental position encoder of the invention depicting the D/A converter and the function generator circuit.
FIG. 3c illustrates the interconnection of the circuit portions depicted in FIGS. 3a and 3b.

FIG. 1 illustrates an encoder slide 1 employed in the optoelectronic encoder of the present invention schematically illustrated in FIGS. 3a and 3b. The slide is coupled on one side through a bushing 6 to an accelerator pedal 5 by means of a partially shown mechanical linkage 3 and on its other side to a lever 4 through a bushing 2 and a similar linkage 3. The letter S represents the "at rest" or start positions of pedal 5 and lever 4 and the letter T represents the maximum or full throttle position. Bushings 2 and 6 mount slide 1 in an accelerator assembly housing (not shown) and together with mechanical linkage 3 are the sole points in the encoder subject to mechanical wear, which fact contributes to its durability.

Although encoder slide 1 is shown as operable by means of lever 4 and accelerator pedal 5, it is to be understood that in any given embodiment only one is typically employed.

Encoder slide 1 includes two groups of eight optically transparent windows 7 and 8 fabricated in tandem, colinearly with the direction of slide movement as indicated by horizontal arrows alongside mechanical linkage 3. Transparent windows 7 encode one output waveform N (FIG. 7) while windows 8 encode another waveform M (FIG. 7) phase-shifted from waveform N by 90°. Opaque area 9 in cooperation with the portion of slide 1 beyond edge E encodes zero-reference (at rest) position of the accelerator control. In one embodiment, encoder slide 1 travels a distance of one-half inch (14 mm) in response to actuation of throttle pedal 5 or lever 4 from position S to position T. This provides an output voltage which is amplitude-variable in thirty-two steps from maximum to minimum.

Figure 2:
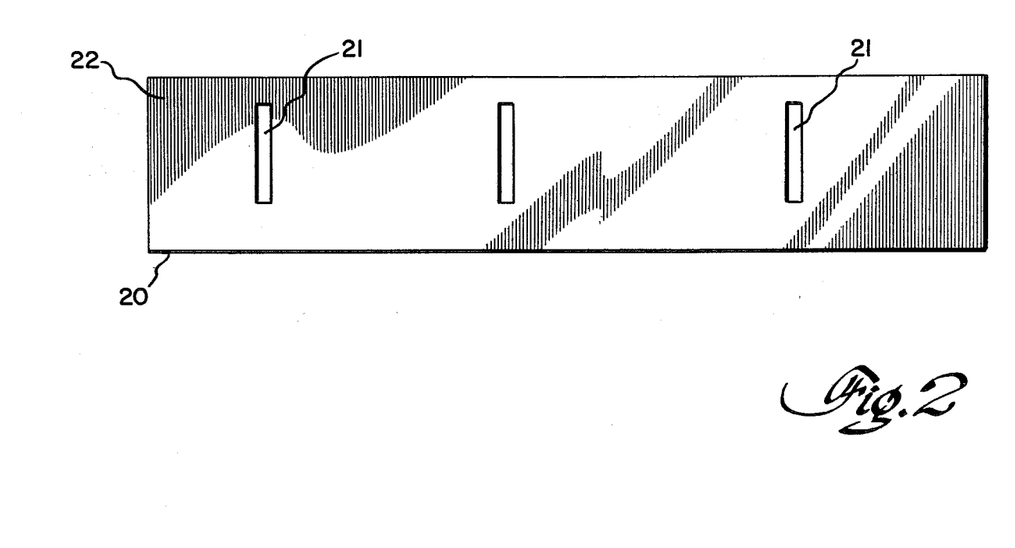
FIG. 2 illustrates a mask employed in the optoelectronic encoder of the invention.

FIG. 2 illustrates mask 20 having 10 mil wide slots 21 fabricated on an opaque strip 22. Slots 21 are made sufficiently narrow and mask 20 is fixedly mounted at a suitable distance from photodetectors 44–46, shown in FIG. 3a, to prevent stray light from adjacent light-emitting diodes 40–42 from unintentionally striking any of the photodetectors 44–46.

Encoder slide 1 and mask 20 may be stamped or etched from nonreflective metal strips. Such fabrication methods and materials are considerably less expensive than sputtering chromium on glass, as is done in the manufacture of some encoder slides. Alternatively, encoder slide 1 and mask 20 may be fabricated as thick film opaque material on glass or transparent film laminated in plastic. Bushings 2 and 6 may be of the type known as "graphitar bushings".

The preferred embodiment of the linear and nonlinear encoder is schematically illustrated in FIGS. 3a and 3b. The embodiment of the linear encoder which is discussed first, employs an open circuit (FIG. 3b) between points X—X and a conductive shunt coupling points Y—Y, thereby electrically disconnecting a nonlinear gain circuit 34 of a function generator circuit 33.

The optoelectronic encoder comprises three main circuit portions 31–33, illustrated in FIGS. 3a and 3b, which comprise portions of a single circuit schematic. FIG. 3c illustrates the interconnection of schematic portions depicted in FIGS. 3a and 3b. Encoder assembly 31 provides a five bit binary coded output signal at output terminals R–V (FIG. 3a). The binary coded output signal may be utilized directly to drive a digital traction drive controller (not shown). However, in the preferred embodiment, the binary signals are applied to a D/A converter 32 (FIG. 3b) and the analog output thereof is coupled to a function generator circuit 33. A linear output voltage $V_{out}$ appears at the collector of transistor 85 which forms part of the function generator circuit.

Figure 4:
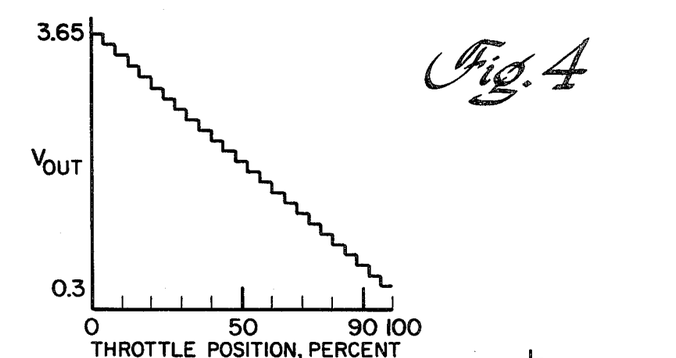
FIG. 4 is a graphical depiction of the linear output voltage function produced by the optoelectronic position encoder of the invention.

An exemplary linear output voltage $V_{out}$ appearing at the output of function generator circuit 33 is depicted graphically in FIG. 4 as a step-wise, negatively sloped, linearly decreasing function of throttle position. At the 0 percent throttle position point of FIG. 4, which corresponds to rest position S in FIG. 1, the output voltage is approximately 3.65 volts. Progressive movement of the accelerator from point S to maximum travel point T, 100 percent on the horizontal throttle position axis, causes voltage $V_{out}$ to decrease in step-wise manner to 0.3 volts, which is the minimum voltage drop across output transistor 85. For clarity of description, FIG. 4 shows the decrease of voltage $V_{out}$ from maximum to minimum value in fewer than thirty-two steps; however, the embodiment illustrated in FIGS. 3a and 3b provides a thirty-two step voltage resolution. Each step change in voltage corresponds to the increment or decrement of one binary count in response to the movement of encoder slide 1.

The detailed circuitry of encoder 31 (FIG. 3a) includes light-emitting diodes 40-42 coupled in series-aiding fashion. Diodes 40-42 are energized through current-limiting resistor 43 connected to the anode of diode 40. The cathode of the diode 42 is connected to ground. Phototransistors 44-46 are each energized through a load resistance $R_L$ in the collector circuit thereof, respectively. The emitter of each of phototransistors 44-46 is connected to ground. Diodes 40-42 and phototransistors 44-46 comprise an optical interrupter assembly through which slide 1 is positioned to move. Conveniently, the optical interrupter may be made of three integral optoelectronic interrupter devices, each comprising a light-emitting diode optically aligned with a phototransistor (commercially available from the Semiconductor Products Department of the General Electric Company, Syracuse, N.Y.). For example, diode 40 and phototransistor 44 comprise one such optoelectronic interrupter. In the preferred embodiment, three such interrupters, comprising infrared-emitting diode and infrared-sensing phototransistor pairs 40 and 44, 41 and 45, and 42 and 46, are mounted side by side to produce a complete optical interrupter assembly.

Encoder 31 also includes mask 20 fixedly mounted adjacent to phototransistors 44-46. Mask slots 21 are positioned in optical alignment with diodes 40-42 and phototransistors 44-46. An encoder slide 1 is movably mounted between mask 20 and diodes 40-42. In response to linear accelerator motion transmitted to slide 1 by means of mechanical linkage 3, slide 1 moves linearly across the optical paths between diodes 40-42 and phototransistors 44-46. The slide's line of travel is indicated by pointed arrows shown alongside mechanical linkage 3. As the slide moves, windows 7 and 8, opaque area 9, and edge E selectively intercept the optical paths between diodes 40-42 and phototransistors 44-46, so that a bit (0 or 1) appears on the collector of each of phototransistors 44-46. The output of the phototransistor goes low (from 1 to 0) when light impinges thereon.

Figure 7:
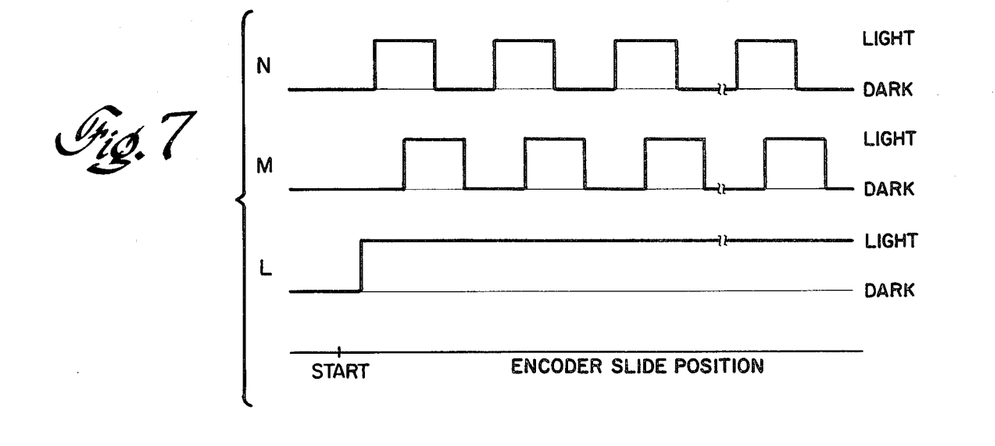
FIG. 7 depicts signal waveforms associated with the encoder assembly of the invention.

The signal appearing at the collector of each of phototransistors 44-46 is supplied to inverting Schmitt trigger circuits 47-49, respectively. The resulting waveforms, designated N, M, and L are shown in FIG. 7 and correspond to the outputs of Schmitt triggers 47-49, respectively. Schmitt trigger-inverter circuits 47 and 48 provide logical outputs A and B, which are then converted to the complements thereof $\bar{A}$ and $\bar{B}$, respectively, by similar Schmitt trigger-inverter circuits 50 and 51, respectively. Logical outputs A, $\bar{A}$, B, and $\bar{B}$ are connected to similarly designated inputs of an up-decoder 52 and a down-decoder 53, athough for clarity the actual connections are not shown in FIG. 3a. Decoders 52 and 53 are each implemented by one-half of one-out-of-four decoder circuit such as a Motorola semiconductor device MC14539. Up-decoder 52 sequentially selects A, B, $\bar{A}$, or $\bar{B}$ as its Z output, depending on the binary bit pattern at its terminals $S_1$ and $S_0$, which are coupled respectively to outputs $Q_A$ and $Q_B$ of digital up-down counter 54. Similarly, B, $\bar{A}$, $\bar{B}$, or A are selected sequentially as the Z output of down-decoder 53, depending on the binary bit pattern at its terminals $S_1$ and $S_0$, also coupled, respectively, to the outputs $Q_A$ and $Q_B$ of counter 54. The respective Z outputs of decoders 52 and 53 are coupled respectively to the "up" and "down" inputs of counter 54 through monostable ("one-shot") circuits 55 and 56 which may be implemented by an integrated circuit device such as a Motorola device MC14528. Counter 54, implemented with two integrated circuit devices such as the National Semiconductor device CD40193, increments the count up when its "up" input is activated and decrements the count down when its "down" input is activated. The binary count, respresentative of the position of encoder slide 1, appears at counter output terminals $Q_A$-$Q_E$ and at terminals R-V.

NAND gates 57 and 58, having their respective inputs connected to counter outputs $Q_A$-$Q_E$, detect maximum and minimum counts, respectively, and ensure that the counter count is always within the desired range (0-31, for a five bit counter). NAND gate 57 detects maximum counter count (all "1's") and through Schmitt trigger-inverter circuit 59, connected to the $\bar{E}$ terminal of up-decoder 52, disables the up-decoder if the maximum count is exceeded. NAND gate 58, having its output connected to the $\bar{E}$ input of down-decoder 53 detects the minimum count (all "0's") and disables the down-decoder.

The resetting of counter 54 to zero upon application of initial power is accomplished through Schmitt-trigger inverter circuit 49 coupled at its input to the collector of phototransistor 46 and at its output to an input of a NOR gate 157 (see FIG. 3a) which is connected at its output to the $C_L$ (reset) inputs in each of the stages making up counter 54. The other input of NOR gate 157 is coupled to a voltage source through a parallel connected diode 159 and resistor 158, and to ground through capacitor 60. Diode 159 allows fast discharge of capacitor 60 such that removal or reapplication of power results in counter 54 being reset to zero.

Operation of encoder assembly 31 may be best understood with reference to FIG. 3a and the waveforms N, M, and L shown in FIG. 7. Encoder slide 1 of encoder assembly 31 is positioned such that in the "at rest" or start position opaque regions 9 thereof block the respective optical paths between diode-phototransistor pairs 40 and 44, 41 and 45, and 42 and 46 so that phototransistor outputs are high (logic 1). As the slide is moved in the direction indicated by the arrows alongside mechanical linkage 3, the trailing slide edge-E crosses the optical path between diode-phototransistor pair 42 and 46 first so that light from the diode strikes the phototransistor, setting the counter to zero and enabling it to begin accumulating counts. This transition is depicted by a dark-to-light transition in waveform L, corresponding to the output of Schmitt trigger inverter 49. Next, as the slide continues to move, the edge of the first of transparent slide windows 7 allows light from diode 40 to impinge upon phototransistor 44 indicating a first dark-to-light (low-to-high) transition in waveform N appearing at the output of a Schmitt trigger-inverter 47. Since counter 54 had been reset to all "0's", terminals $Q_A$ and $Q_B$ both being 0, inputs A and B of encoders 52 and 53, respectively, are enabled such that the signals appearing thereon also appear at the respective Z outputs of the encoders. Monostable circuits 55 and 56 provide drive pulses to "up" or "down" inputs of counter 54, respectively, only upon the occurrence of a low-to-high transistion at the Z output of encoder 52 or 53, respectively. Thus, since a low-to-high transition occurs at the output A of Schmitt trigger-inverter 47, while output B of Schmitt trigger-inverter 48 remains unchanged, monostable circuit 55 provides a narrow pulse to the "up" input of counter 54 incrementing the count to 1. Continued slide movement in the indicated direction next aligns the first of transparent slide windows 8 with diode 41 and phototransistor 45 causing a high-to-low transition to occur at the phototransistor collector and a low-to-high transition to occur at output B of Schmitt trigger-inverter 48 as indicated by waveform M in FIG. 7. Since the counter has accumulated a binary count of 1 ($Q_A=1$ and $Q_B=0$), inputs $\overline{B}$ and $\overline{A}$ of decoders 52 and 53, respectively, are both enabled. However, as the low-to-high transition occurs at output B of Schmitt trigger-inverter 48, output B is selected by up-decoder 52 and the count in counter 54 is incremented to 2. Continued motion of the slide results in a (high-to-low) transition in waveform N. At this point $Q_A=0$ and $Q_B=1$, whereupon inputs $\overline{A}$ and $\overline{B}$ of decoders 52 and 53, respectively are enabled. A low-to-high transition occurs at the A output of Schmitt trigger-inverter 50 causing $\overline{A}$ input to up-decoder 52 to be selected and the counter incremented to 3. In this manner, as the counter advances upward, the $Q_A$ and $Q_B$ output states select which channel and which edge will be allowed to count the counter upward.

In a similar manner, the counter counts down when a low-to high transition is steered through down-decoder 53 and monostable circuit 56 which provides a narrow pulse to decrement counter 54. For instance, the point at which waveform N has moved just beyond its first light-to-dark transition and at which waveform M is high (light) corresponds to a count of 3. As the direction of movement of encoder slide 1 is reversed, (i.e., slide movement is opposite to the direction indicated by arrows alongside linkage 3, FIG. 3a), the first transition encountered would be in waveform N and would be low-to-high transition. The count of 3 corresponds to $Q_A=1$ and $Q_B=1$, so that inputs $\overline{B}$ and A of encoders 52 and 53, respectively are enabled. Since the low-to-high transition occurs at output A of Schmitt trigger-inverter 47 (waveform N), the A input of down-decoder 53 is selected and applied through monostable circuit 56 to counter 54 causing a decrement in the count from 3 to 2. In this manner, the counter accumulates a count indicative of the position of the slide and hence the position of the accelerator pedal or lever. The counter adds positive increments and subtracts negative increments from the initial reference determined by the reset channel.

The binary output from counter 54 also appears at points R–V and is applied to inverters 61–65 of D/A converter 32 (FIG. 3b). Inverters 61–65 provide drive to a resistor ladder comprising resistors 66–76. Resistors 71–76 are connected in series. The free ends of resistors 71 and 76 are connected to ground. The outputs of inverters 61–65 are respectively coupled through resistors 70–66 to the common point between resistors 71–72, 72–73, 73–74, 74–75, and 75–76, respectively.

The D/A converter output signal appearing at the common point of resistors 75 and 76 is connected to the positive input of an unity gain, voltage-follower operational amplifier 77. A feedback resistor 81 couples the output of amplifier 77 to its negative input. The output signal from amplifier 77 is applied through resistor 82 to the negative input of an operational amplifier 80. The output of amplifier 80 is coupled through a resistor 83 to the base of transistor 85 which is also coupled to ground by a resistor 104. The combination of amplifier 80 and transistor 85 function as a single, feedback amplifier. A resistor 86 connected between the collector of transistor 85 and the positive input of amplifier 80 provides amplifier feedback. A capacitor 87, shunting resistor 86, and a capacitor 88, shunting the negative input of amplifier 80 and its output, provide loop stabilization. The negative and positive inputs of amplifier 80 are coupled to ground through resistors 90 and 89, respectively.

The linear output voltage $V_{out}$ on the collector of transistor 85 provides drive to a traction drive control circuit which includes a load resistor (not shown) for transistor 85 through a low-value resistor 91. Amplifier 80 provides a high input impedance so as not to load down the input resistor network comprising resistors 82 and 90 in the linear encoder, and resistors 82, 92, 93, and 94 in the nonlinear encoder 34 (described infra). The collector of transistor 85 is connected to ground through capacitor 95, and in combination with low-value resistor 91 provides protection for transistor 95 against transients that may otherwise be present on its collector. The transients, for example, may be due to the switching of battery voltage energizing the traction drive motor.

The gain of amplifier 80, given by 1+resistor 86/resistor 89, should be made sufficiently large to compensate for signal attenuation in the D/A converter resistor ladder, and in input resistor network of amplifier 80 comprising resistors 82 and 90 in the linear decoder and resistors 82, 92, 93, and 94 in the nonlinear encoder (described below).

In order to obtain a non-linear output voltage $V_{out}$, the open circuit as points X—X is replaced by a closed conductor and the closed conductor at points Y—Y is replaced by an open circuit. Performing these changes will result in operational amplifiers 78 and 79 of nonlinear gain circuit 34 being parallel-connected with amplifier 77.

Figure 5:
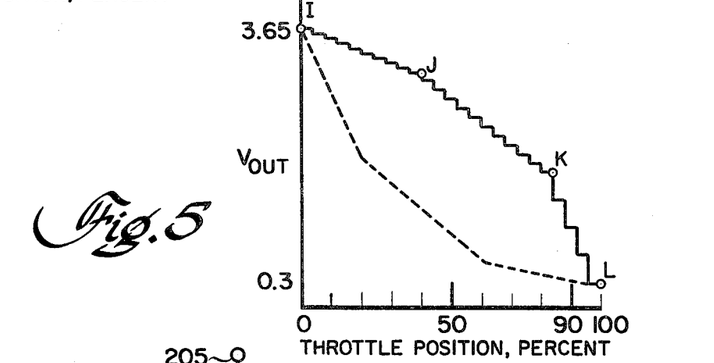
FIG. 5 is a graphical depiction of the nonlinear output voltage function produced by the optoelectronic position encoder of the invention.

An exemplary nonlinear output voltage $V_{out}$ is depicted graphically in FIG. 5 and constitutes a stepped, convex upward, piece-wise-linear function consisting of adjoining, variably sloped, linear segments I-J, J-K, and K-L. Segment I-J is the lowest gain portion of the curve and accordingly provides the smallest variation of voltage $V_{out}$ against change in throttle position. This allows greater control over vehicle acceleration, for example, at start-up. Segments J-K and K-L represent increasingly higher slopes and gain and concomitantly greater change in $V_{out}$ for given change in throttle position. As in FIG. 4, the maximum voltage $V_{out}$ of 3.65 volts occurs when the accelerator is at its rest position and the minimum of 0.3 volts occurs at maximum accelerator displacement.

The positive input of amplifier 78 in nonlinear gain circuit 34 is connected to the output of D/A converter 32, while the output of amplifier 78 is coupled through series-coupled resistors 96 and 92 and electrically-linked points X—X to the negative input of amplifier 80. A feedback resistor 97 couples the output of amplifier 78 to its negative input. The common point between resistors 96 and 92 is coupled to ground through a Zener diode 98. Resistor 99 couples the negative input of amplifier 78 to ground.

The positive input of amplifier 79 is coupled to the output of D/A converter 32. The output of amplifier 79 is coupled through series-coupled resistors 100 and 93, and electrically-linked points X—X to the negative input of amplifier 80. A feedback resistor 101 couples the output of amplifier 79 to its negative input. The common point between resistors 100 and 93 is connected to ground by a Zener diode 102. The respective negative inputs of amplifiers 79 and 80 are coupled to ground through resistors 103 and 94, respectively.

In operation, when the accelerator is initially at its rest position, the amplitude of analog drive voltage from D/A converter 32, when amplified by amplifiers 78 and 79, is sufficiently high to bias Zener diodes 98 and 102 into conduction, clamping each of the outputs of amplifiers 78 and 79 at a fixed voltage. Accordingly, the feed-forward path is through amplifier 77 only and a portion I-J of voltage $V_{out}$, shown in FIG. 5, is generated. As the accelerator is progressively moved toward the maximum throttle position, the analog drive voltage from D/A converter 32 decreases until, at a point J, shown in FIG. 5, it is sufficiently small so that the output voltage of amplifier 78 is no longer high enough to maintain Zener diode 98 in a conductive state. The analog drive voltage is, however, large enough to maintain conduction through Zener diode 102. When Zener diode 98 is nonconductive, the output voltages of amplifier 77 and 78 are summed through resistors 82 and 92 across resistor 94, thereby resulting in greater over-all gain so that portion J-K of the nonlinear function shown in FIG. 5 is generated. As the analog drive signal further decreases, Zener diode 102 is biased into non-conduction, paralleling the outputs of amplifiers 77-79 which are summed essentially through resistors 82, 92, and 93 across resistor 94 and generate the greatest gain segment K-L shown in FIG. 5. (Resistors 96 and 100 are small compared to resistors 92 and 93, respectively, and may be neglected).

While an exemplary curve has been described and illustrated in FIG. 5, any desired upward convex curve may be generated by judicious selection of Zener diodes 98 and 102, the gains of amplifier 78 (given by 1+resistor 97/resistor 99) and amplifier 79 (given by 1+resistor 101/resistor 103) and resistors 82, 92, and 93. Alternatively, concave upward curves may be generated by connecting the anodes of Zener diodes 98 and 102 to a positive voltage source, and judiciously selecting the gains of amplifiers 78 and 79, Zener diodes 98 and 102, as well as resistors 82, 92, and 93. For example, the piece-wise linear curve illustrated by dashed lines in FIG. 5 may be suitable for an on-road electric vehicle. Greater control is provided by the lower gain at increased throttle position. The highest gain and least control is thus provided in the initial segment as required for on-road vehicle speed control.

Figure 6:
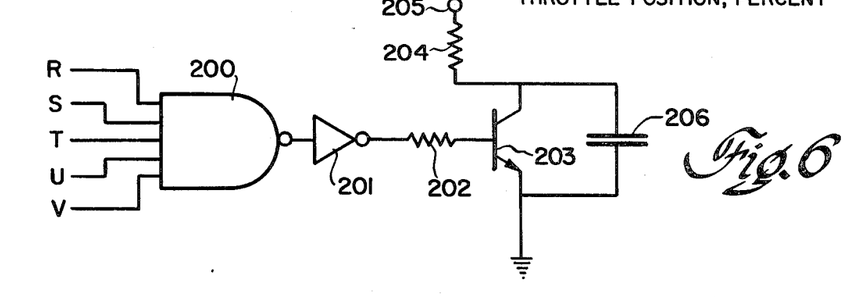
FIG. 6 is a schematic diagram of the "full-on" decode circuit employed in the apparatus of the invention.

FIG. 6 illustrates a "full-on" decode circuit which may be employed in the circuit of the accelerator-encoder of FIGS. 3a and 3b. Outputs R-V from binary encoder 31 (shown in FIG. 3a) drive the corresponding inputs R-V of NAND gate 200, shown in FIG. 6. In response to the detection of a predetermined binary output, for example all 1's, indicating greater than 90 percent throttle displacement (shown in FIGS. 4 and 5), NAND gate 200 provides a signal through inverter 201 and series-coupled resistor 202 to the base of transistor 203. An output voltage indicating the detection of the predetermined binary code appears on the collector of transistor 203 and through a low value resistor 204 on a terminal 205. Low value resistor 204, in conjunction with a capacitor 206 coupling the collector of transistor 203 to ground, provides protection for transistor 203 against transients that may otherwise be present on the collector. The traction drive control circuit, to which transistor 203 is coupled, includes a load resistor (not shown) for transistor 203.

Although the encoder of the present invention may be entirely assembled from discrete components, in the preferred embodiment the encoder is fabricated in the form of a conventional hybrid device which comprises the electrical components of D/A converter 32, function generator circuit 33 (shown in FIG. 3b) and encoder assembly 31 (shown in FIG. 3a) and the "full-on" detect circuit (shown in FIG. 6). Typically, in such hybrid devices, resistive elements and conductors are of the thick film type printed on an insulating alumina substrate. Resistors are intentionally printed with low values, which are subsequently adjustable upward by a process employing a laser and known as "active trimming". Components such as capacitors and transistors, available commercially in a form known as "chip capacitors" or "chip transistors", for example, and discrete devices such as diodes are soldered to conductive contact points on the alumina substrate.

In the preferred embodiment of the linear and nonlinear encoders shown in FIG. 3, the resistance of summing resistors 90 and 94, respectively, is actively trimmed during tests performed in the course of fabricating the encoder hybrid. In this manner, the encoder generates the linear or nonlinear voltage functions having the desired respective slopes without requiring any post-manufacture electrical adjustments. In the embodiment employing an encoder hybrid, the only post-fabrication adjustment necessary is to optically align mask slots 21 with diodes 40-42 and phototransistors 44-46.

From the foregoing, it may be appreciated that the present invention provides a versatile, low-cost, long-life optoelectronic incremental position encoded accelerator control which is reliable, operable over a wide range of operating conditions, and which requires only minimal post-fabrication adjustment. The encoder is subject to relatively few decoding errors due to stray light and skewed encoder components. It exhibits superior immunity to electrical noise and electromagnetic interference. The encoder mask is simple to align and the encoder requires only minimal post-fabrication adjustment.

While certain preferred features of the invention have been shown by way of illustration, many modifications and changes will occur to those skilled in the art. It is, therefore, to be understood that the appended claims are intended to cover all such modifications and changes as fall within the true spirit of the invention.

The invention claimed is:

1. An optoelectronic incremental position encoder for providing a signal indicative of the position of an encoder slide, comprising:
   an optical interrupter assembly, including a plurality of paths for optical wavelength radiation to pass therethrough, and a plurality of photodetectors, each photodetector being situated to receive said radiation in a separate one of said paths of optical wavelength radiation, respectively;
   an encoder slide positioned for linear movement with respect to said interrupter, said slide having optically transmissive windows arranged in tandem and colinear with the line of movement of said slide so that in response to said movement said photodetectors can detect said radiation transmitted through said windows;
   a digital counter;
   means coupled to selected ones of said photodetectors for providing electronic output signals and logic complement signals thereof; and
   decoder means coupled to receive said electronic signals and logic complements thereof from selected ones of said photodetectors, said decoder means being coupled at its output to said counter so that in response to the count thereof said decoder means can select one of the signals applied thereto and supply a signal to said digital counter to cause said counter to count and thereby produce an output signal indicative of the position of said slide.

2. The optoelectronic incremental position encoder of claim 1 further comprising:
a mask having a plurality of slots, said mask being positioned parallel to said slide, adjacent to said photodetectors, said slots being in optical alignment with said photodetectors.

3. The optoelectronic incremental position encoder of claim 1 including an optical radiation source comprising at least one light-emitting diode and wherein each of said photodetectors comprises phototransistors.

4. The optoelectronic incremental position encoder of claim 3 wherein said means coupled to selected ones of said photodetectors comprises:
a first plurality of Schmitt trigger-inverter circuits coupled to selected ones of said phototransistors for providing said electronic output signals; and
a second plurality of Schmitt trigger-inverter circuits coupled to receive said electronic output signals from said first plurality of Schmitt trigger-inverter circuits and provide the logic complements of said electronic output signals.

5. The optoelectronic incremental position encoder of claim 4 wherein said decoder means comprises:
an up-decoder and a down-decoder, each coupled to receive the electronic output signals and logic complements thereof, said up-decoder and said down-decoder each selecting one of the electronic output signals or logic complement thereof based on the count of said counter; and
monostable circuit means coupled to said up-decoder and said down-decoder and responsive thereto for providing said counter with a drive pulse causing said counter to count.

6. The optoelectronic incremental position encoder of claim 5 further comprising:
circuit means for providing a variable amplitude voltage in response to the output signal from said digital counter, wherein the amplitude of said voltage varies in a step-wise manner over the range of travel of said slide and wherein said voltage amplitude correlates to the position of said slide.

7. The optoelectronic incremental position encoder of claim 6 wherein said circuit means for providing a variable amplitude analog voltage comprises:
a D/A converter for converting said counter output signal to an analog signal; and,
function generator means for generating said variable amplitude analog voltage with a selected slope in response to said analog signal.

8. The optoelectronic incremental position encoder of claim 7 wherein said function generator means for generating said variable amplitude analog voltage includes means for adjusting the slope of said variable amplitude analog voltage as a linear function of the position of said slide.

9. The optoelectronic incremental position encoder of claim 8 including mechanical linkage means coupling said slide to an accelerator control means whereby linear motion of said accelerator control means causes linear slide motion across said interrupter assembly.

10. The optoelectronic incremental position encoder of claim 7 wherein said function generator means includes means for generating said variable amplitude analog voltage as a multi-segment, piece-wise linear function of the position of said slide such that the slope of each segment of said piece-wise linear function is different from the slope of any adjoining segment.

11. The optoelectronic incremental position encoder of claim 10 wherein said function generator means comprises:
a plurality of parallel coupled amplifier circuits for amplifying said analog signal from said D/A converter, and means coupled to the output of each of said amplifier circuits, respectively, for clamping the output of predetermined ones of said amplifiers so that the sum of the output voltages of the amplifiers with unclamped outputs generates a segment of said variable amplitude analog voltage at a multi-segment, piece-wise linear function.

12. The optoelectronic incremental position encoder of claim 11 wherein said means for clamping the output of predetermined ones of said amplifiers comprises Zener diode means.

13. The optoelectronic incremental position encoder of claim 11 including mechanical linkage means coupling said slide to an accelerator control means whereby linear motion of said accelerator control means causes linear slide motion across said interrupter assembly.

14. The optoelectronic incremental control of claim 9 or claim 13 further comprising:
means coupled to said digital counter for detecting a predetermined count and for providing a signal in response thereto.

* * * * *